(12) United States Patent
Kukal et al.

(10) Patent No.: US 10,285,276 B1
(45) Date of Patent: May 7, 2019

(54) METHOD AND APPARATUS TO DRIVE LAYOUT OF ARBITRARY EM-COIL THROUGH PARAMETRIZED CELL

(71) Applicant: Cadence Design Systems, Inc., San Jose, CA (US)

(72) Inventors: Taranjit Kukal, Delhi (IN); Arnold Ginetti, Antibes (FR); Steven R. Durrill, Campbell, CA (US); Abhay Agarwal, Nashua, NH (US); Vikas Kohli, Noida (IN); Tyler Lockman, New Port Richey, FL (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

(21) Appl. No.: 15/275,230

(22) Filed: Sep. 23, 2016

(51) Int. Cl.
*G06F 11/22* (2006.01)
*G06F 17/50* (2006.01)
*H05K 3/00* (2006.01)

(52) U.S. Cl.
CPC ....... *H05K 3/0005* (2013.01); *G06F 17/5072* (2013.01); *G06F 17/5081* (2013.01); *G06F 2217/74* (2013.01)

(58) Field of Classification Search
CPC ..... H01L 27/14692; H01L 2924/19041; H01L 2924/19042; H01L 2924/19043; G06F 2203/04103; G06F 2203/04104; G06F 2203/04106; G06F 3/0414; G06F 3/044; G06F 3/045; G06F 2203/04105; G06F 3/03545; G06F 3/0416; G06F 3/0418; G06F 3/046; G06F 3/047; G06F 13/1694; G06F 21/79; G06F 21/86; G06F 2221/2129; G06F 19/321; G06F 1/163
USPC ................... 716/118–125, 136–139
See application file for complete search history.

(56) References Cited

U.S. PATENT DOCUMENTS

| | | | |
|---|---|---|---|
| 8,650,518 B2 * | 2/2014 | Bhattacharya | G06F 17/5081 716/106 |
| 9,286,421 B1 | 3/2016 | Kukal et al. | |
| 2008/0178139 A1 * | 7/2008 | Pfeil | G06F 17/5068 716/126 |
| 2014/0165020 A1 * | 6/2014 | Yeh | G06F 17/5072 716/122 |

* cited by examiner

*Primary Examiner* — Binh C Tat
(74) *Attorney, Agent, or Firm* — McDermott Will & Emery LLP

(57) ABSTRACT

A method is provided that includes receiving shape data specifying a shape of an electromagnetic (EM) structure in a circuit layout and transferring the shape data to a schematic cell representation based on a logic function of the EM structure and package technology layers of the circuit layout. The method includes placing a symbol for the EM structure in the schematic cell representation, associating the shape data and a model path with a cell parameter in the symbol, mapping the shape data to the package technology layers, and specifying pins in the schematic cell representation according to the shape data. Further, the method includes verifying ports for the EM structure and placing the EM structure in a package layout for a printed circuit board (PCB). A system and a non-transitory, computer readable medium storing commands to perform the above method are also provided.

19 Claims, 11 Drawing Sheets

METHOD AND APPARATUS TO DRIVE LAYOUT OF ARBITRARY EM-COIL THROUGH PARAMETRIZED CELL

BACKGROUND

Field of Disclosure

Embodiments described herein are generally related to the field of circuit design and more particularly to designing circuit layouts including arbitrary electromagnetic (EM) coils in radio-frequency (RF) systems.

Related Art

Electronic circuit designs for RF systems include multiple instances where EM coils are included, such as antennas for receivers, transmitters, and transceivers, power converting and management components, and also in Voltage Controlled Oscillators (VCOs) or Phase Locked Loops (PLLs). With the advent of more stringent requirements for power management and antennae performance, EM coil designs have become increasingly challenging as irregular or arbitrary shapes are generated by specialized electro-magnetic (EM) tools. Arbitrary shapes may be non-symmetric and therefore difficult to synthesize through equations that define physical shapes through a few parameters. Conventional techniques include manually creating a model for the arbitrary shaped EM coil, to later modify the model, also by hand, according to simulation results. The lack of a physical layer representation of the arbitrary EM coil implies that multiple designs need to be manually prepared and separately considered as variants for a single device model, inducing excessive time cost while reducing optimization routine effectiveness.

The description provided in the background section should not be assumed to be prior art merely because it is mentioned in or associated with the background section. The background section may include information that describes one or more aspects of the subject technology.

SUMMARY

In a first embodiment, a method includes receiving shape data specifying a shape of an electromagnetic (EM) structure in a circuit layout and transferring the shape data to a schematic cell representation based on a logic function of the EM structure and a plurality of package technology layers of the circuit layout. The method may also include placing a symbol for the EM structure in the schematic cell representation, associating each of the shape data and a model path with a cell parameter in the symbol for the EM structure, mapping the shape data to the plurality of package technology layers, and specifying a plurality of pins in the schematic cell representation according to the shape data. Further, in some embodiments the method includes verifying a number of ports for the EM structure by associating each pin in the schematic cell representation to a port in the circuit layout and placing the EM structure in a package layout for a printed circuit board (PCB).

In a second embodiment, a system includes a memory, storing computer code and at least one processor that executes the computer code. The computer code causes the system to receive shape data specifying a shape of an electromagnetic (EM) structure in a circuit layout and transfer the shape data to a schematic cell representation based on a logic function of the EM structure and a plurality of package technology layers of the circuit layout. Also, the computer code causes the system to place a symbol for the EM structure in the schematic cell representation, associate each of the shape data and a model path with a cell parameter in the symbol for the EM structure, map the shape data to the plurality of package technology layers, and specify a plurality of pins in the schematic cell representation according to the shape data. Further, in some embodiments the computer code causes the system to verify a number of ports for the EM structure by associating each pin in the schematic cell representation to a port in the circuit layout and place the EM structure in a package layout. In some embodiments, receiving shape data comprises receiving shape data for an EM coil, a meander, a taper, or any combination of the above.

In yet another embodiment, a non-transitory, computer readable medium stores commands which, when executed by a processor cause a computer to perform the steps of: receiving shape data specifying a shape of an electromagnetic (EM) structure in a circuit layout, and transferring the shape data to a schematic cell representation based on a logic function of the EM structure and a plurality of package technology layers of the circuit layout. In some embodiments, the commands cause the computer to perform the steps of placing a symbol for the EM structure in the schematic cell representation, associating each of the shape data and a model path with a cell parameter in the symbol for the EM structure, and mapping the shape data to the plurality of package technology layers. Further, in some embodiments the commands cause the computer to perform the steps of specifying a plurality of pins in the schematic cell representation according to the shape data, verifying a number of ports for the EM structure by associating each pin in the schematic cell representation to a port in the circuit layout, and placing the EM structure in a package layout for a printed circuit board (PCB). In some embodiments, receiving shape data comprises receiving shape data for an EM coil, a meander, a taper, or any combination of the above, and retrieving the circuit layout from a graphic database system (GDS) file associated with the electric circuit.

Further according to some embodiments, a system includes a memory, storing computer code and at least one processor that executes the computer code. The computer code causes the system to receive shape data specifying a shape of an electromagnetic (EM) structure in a circuit layout and transfer the shape data to a schematic cell representation based on a logic function of the EM structure and a plurality of package technology layers of the circuit layout. Also, the computer code causes the system to place a symbol for the EM structure in the schematic cell representation, associate each of the shape data and a model path with a cell parameter in the symbol for the EM structure, map the shape data to the plurality of package technology layers, and specify a plurality of pins in the schematic cell representation according to the shape data. Further, in some embodiments the system includes a means to verify a number of ports for the EM structure by associating each pin in the schematic cell representation to a port in the circuit layout and place the EM structure in a package layout for a printed circuit board (PCB). In some embodiments, receiving shape data comprises receiving shape data for an EM coil, a meander, a taper, or any combination of the above.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

Figure 1:
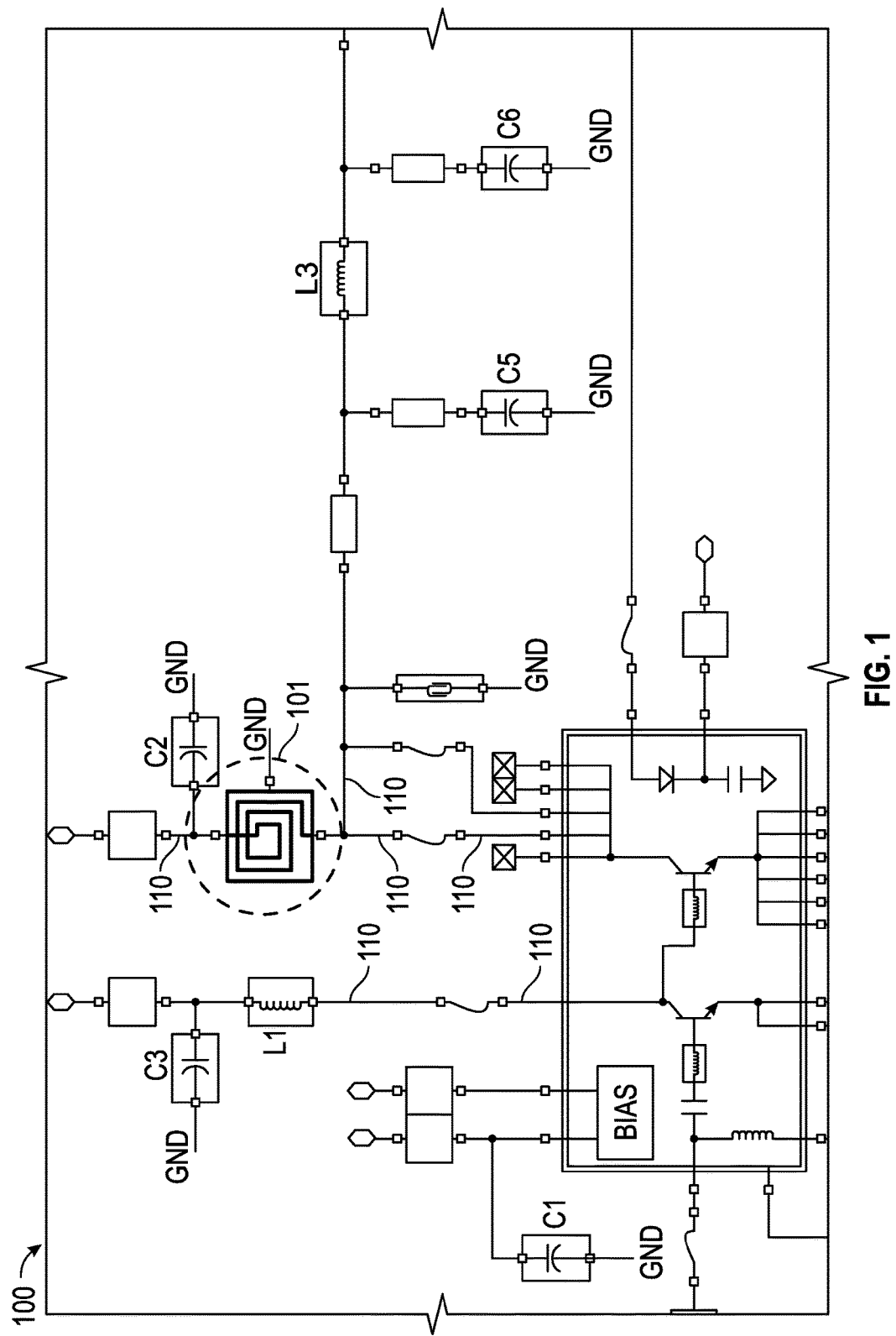
FIG. 1 illustrates a circuit layout including an EM coil, according to some embodiments.

In today's electronic circuit designs, RF systems are pervasive due to the massive penetration of mobile devices in consumer electronic markets. EM coils are important elements of RF system design for use as antennas, voltage transformers, VCOs, PLLs, and the like. EM coil design flow has become challenging given the desire for high performance antennas and the increasing complexity of power management circuitry, among other applications. Embodiments as provided herein provide design tools to handle, simulate, optimize, and place EM coils in RF circuit layouts. EM coils as disclosed herein are made of silicon or any other package substrate material used in EM circuit manufacturing including any other semiconductor compound, a metal, or any combination of the above. More generally, embodiments as disclosed herein may include not only EM coils but also any other conductive shape used in RF circuit design, such as a meander structure, a taper structure, or any combination of the above. Accordingly, methods and tools disclosed herein may be equally applicable to handling EM circuits having any of the above structures in any arbitrary geometrical shape or combination of shapes.

In addition to handling EM coils having regular shapes (e.g., shapes configurable through simple mathematical formulas), embodiments consistent with the present disclosure are able to handle EM coils having arbitrary shapes. A regular shape is understood herein as a shape configurable through simple mathematical formulas or through the use of physical parameters that can drive equations of the physical drawing of the shape. A design tool as disclosed herein may use physical parameters to determine the shape of the coil layout through computation, when the coil layout has a regular shape. For example, a simple spiral coil (e.g., for an RF antenna) may be described by an equation that parametrizes a radius, r, as a function of an angle, θ, in the plane of the circuit, given a certain width, a spacing between the traces, and a number of turns in the spiral. An irregular or asymmetric shape is one that is not regular. An arbitrary shape may include a regular shape, an irregular shape, an asymmetric shape, or any combination of the above. In some embodiments, the design tool includes a parametrized layout structure (pcell) associated with the EM coil. The pcell of a regular-shape EM coil is driven by parameter values in a corresponding schematic instance for the EM coil. Pcells for regular-shape EM coils are not suited to handle irregular-shape coils provided by standard, $3^{rd}$ party EM tools.

Third party EM tools output coil shapes as graphic database system (GDS) data and corresponding electrical models for the EM coils are output as 'spice' or 's-parameter' files. Embodiments as disclosed herein provide design flows that work with GDS data files and 'spice' or 's-parameter' files as well. Thus, design tools as disclosed herein may verify the consistency of an EM coil layout with the EM coil model and with an EM coil schematic symbol even when the EM coil layout is irregular or asymmetric. Typically, irregular or asymmetric coils are created, tuned and extracted by a large collaborative effort and have many variants or parameters that can be adjusted or modified for improved performance. Each of these variants is stored as a separate GDS file and model file in at least one of a plurality of databases, creating large resource libraries associated to a single EM coil element (or meander, taper, or combination of the above). A user of a conventional design tool looking to optimize the performance of a certain RF system that includes an irregular EM coil then browses manually through the different variants before locking on a model that performs adequately. Accordingly, handling asymmetric coils in a conventional design tool is cumbersome and error prone.

Design tools as provided herein provide schematic symbols for asymmetric EM coils without manual handling the EM coil parameters. Further, in some embodiments EM coil footprints are provided automatically, as an optimization routine modifies model parameters, thus relieving the need to keep all variants of an EM coil model in database libraries. Design tools as disclosed herein automatically create symbols and layout footprints for the EM coils. Further design tools as disclosed herein ensure consistency across schematic, simulation and layout views, for EM coil designs. Moreover, some embodiments include the associated pins and pin pads for the EM coil in a symbol of a schematic cell representation.

Some embodiments may be described as including a "package layout" and a "package schematic," as disclosed herein. Some embodiments may include an "IC layout" and an "IC schematic." Further, some embodiments may include a "PCB layout" and a "PCB schematic" flow. Accordingly, embodiments of the present disclosure are independent of fabric used for the circuit design.

FIG. 1 illustrates a circuit layout 100 including an EM coil 101, according to some embodiments. Circuit layout 100 may be associated with any type of RF system, such as a receiver, transmitter, and a transceiver for handling wireless communications, or any subcomponent of the above, such as a VCO, a PLL and the like. Layout 100 includes several components coupled to each other through connectors 110. EM coil 101 may be more generally an EM structure associated with the RF system, such as a coil, a meander, a taper, or any combination of the above. Furthermore, the shape of EM coil 101 may be regular or symmetric, or may be irregular or asymmetric, according to some embodiments.

Methods and tools as disclosed herein use circuit layout 100 as an input to generate a package layout including multiple layers (i.e., 'technology layers'). The package layout will be used to produce a printed circuit board (PCB) including circuit components coupled as illustrated in layout 100 and operating as desired for the circuit design.

Figure 2:
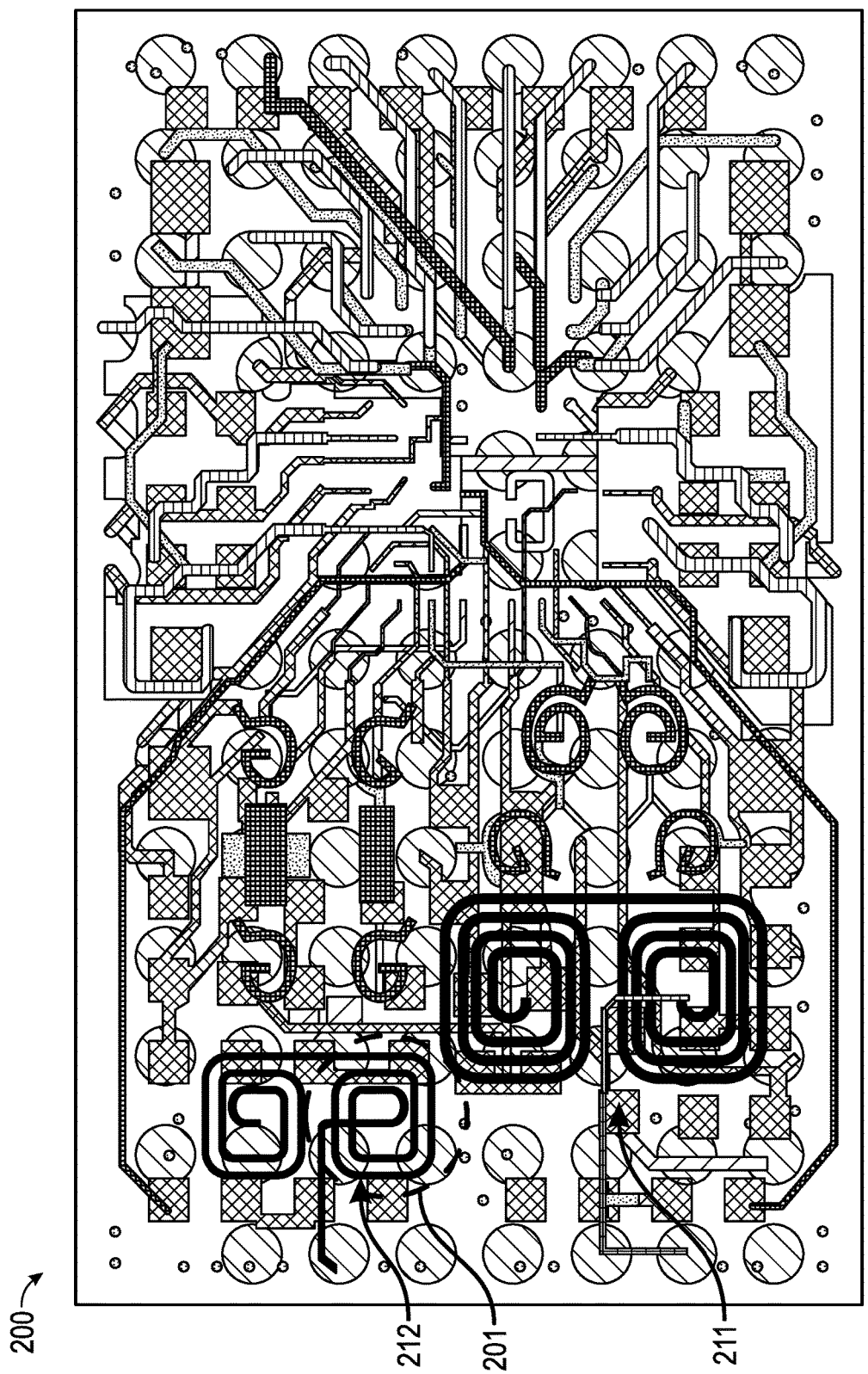
FIG. 2 illustrates a schematic cell representation of a circuit, according to some embodiments.

FIG. 2 illustrates a schematic cell representation 200 of a circuit, according to some embodiments. Schematic cell representation 200 may be provided by a cross fabric design environment (CFDE) tool using circuit layout 100. Schematic cell representation 200 may be a schematic generated from circuit layout 100 by reading its connectivity structures and importing the models of layout traces. As shown, schematic cell representation 200 includes a parametrized cell (pcell) 201 of EM coil having a trace 212 and electrically coupled to a pin 211. Pcell 201 includes parameters associated with the electrical performance of EM coil 101. Accordingly, when a user points to pcell 201 in schematic cell representation 200, the user has access to a GDS file for a circuit layout (e.g., layout 100) including the shape as well as to an s-parameter file associated with EM coil 101. In some embodiments, the GDS file may be provided by a $3^{rd}$ party EM tool.

Figure 3:
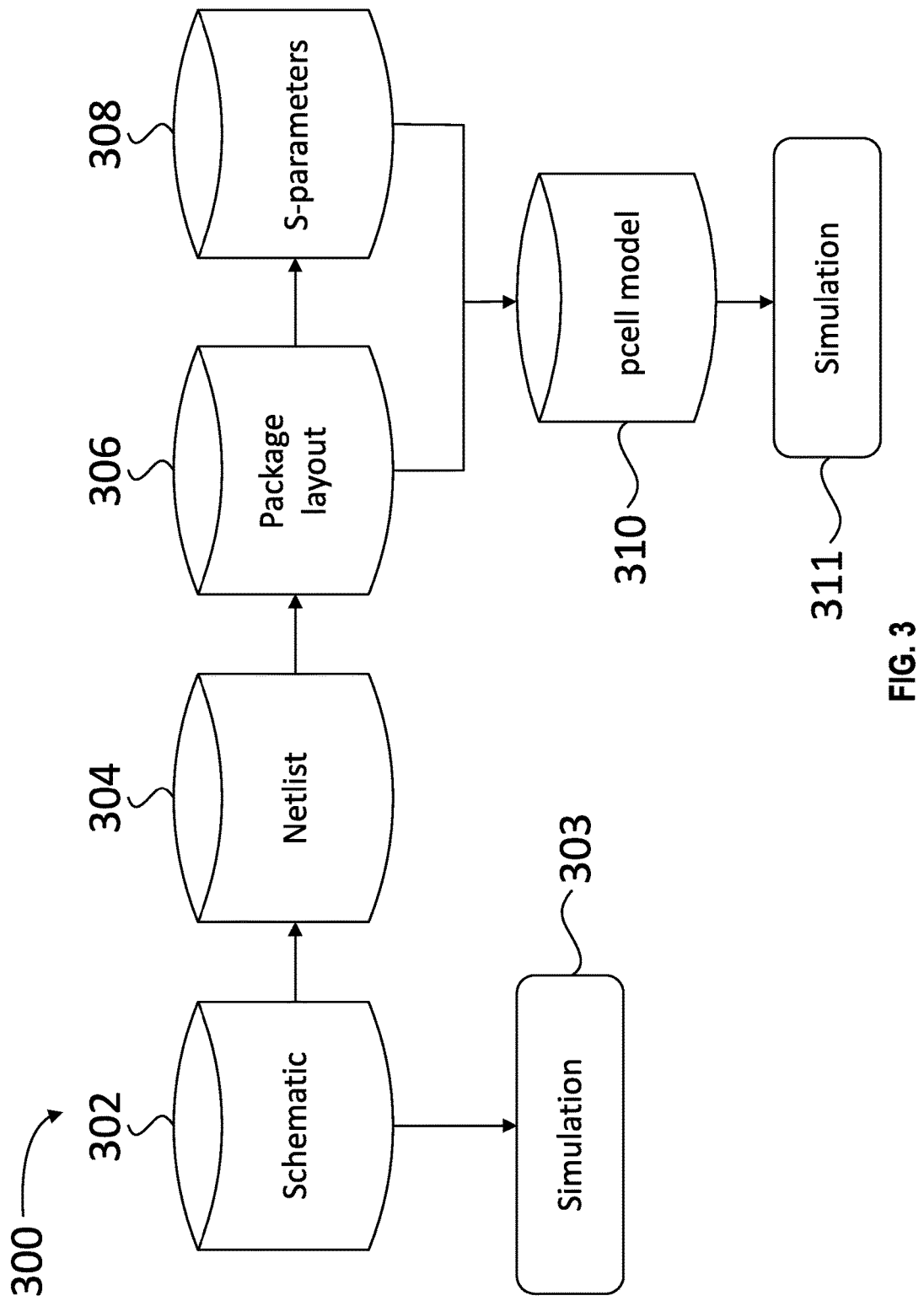
FIG. 3 illustrates a graphic database flow for handling an EM coil in a circuit, according to some embodiments.

FIG. 3 illustrates a graphic database flow 300 for handling EM coil 101 in a circuit, according to some embodiments. Schematic database 302 may include a package technology file, an EM coil GDS file, and a model file. The EM coil GDS file includes the shape of the EM coil (or meander, taper, or any combination of the above). In some embodiments, files in database 302 may be provided by a $3^{rd}$ party EM tool.

Netlist database 304 may include a schematic cell representation including a pcell layout of the circuit. The pcell layout in Netlist database 304 results from parsing connectors 110 in layout 100 to form the corresponding pcell layout establishing a connectivity map between the different components in layout 100, and the component definitions. In addition, the pcell layout in Netlist database 304 includes layout data of the EM coil even for the case of an irregular EM coil (e.g., a coil, a meander, a taper, or any combination of the above). The schematic cell representation in Netlist database 304 includes at least a GDS file, a physical file including the electric model of a device component, a technology layers file, and a technology map (tech-map') linking the device component in the GDS file to each of the technology layers in the technology layers file.

Package layout database 306 stores a compound file including a GDS file, a tech-map, and the pcell layout from netlist database 304. S-parameter database 308 includes model parameters for the circuit associated with the data in package layout database 306. Files in S-parameter database 308 represent the electrical behavior of the EM coil. Accordingly, s-parameter database 308 includes parameters associated with an EM coil model, and the EM coil model itself. In some embodiments, data stored in s-parameters database 308 may be provided by a $3^{rd}$ party EM tool i.e., the $3^{rd}$ party EM tool that generates the GDS file for the EM coil.

Some embodiments may include a pcell model database 310 storing an electrical model of the EM coil that includes parasitic schematic information resulting from simulation steps 303 and 311. Simulation steps 303 and 311 are performed with data collected from schematic database 302 and from pcell parasitic schematic database 310, respectively. For example, schematic cell representation 200 may be stored in pcell model database 310. Accordingly, for an irregular EM coil (or meander, taper, or any combination of the above), the shape of trace 212 in pcell 201 may not be generated by a formula, but may be associated to the corresponding GDS shape file (e.g., as provided by the $3^{rd}$ party EM tool).

Figure 4:
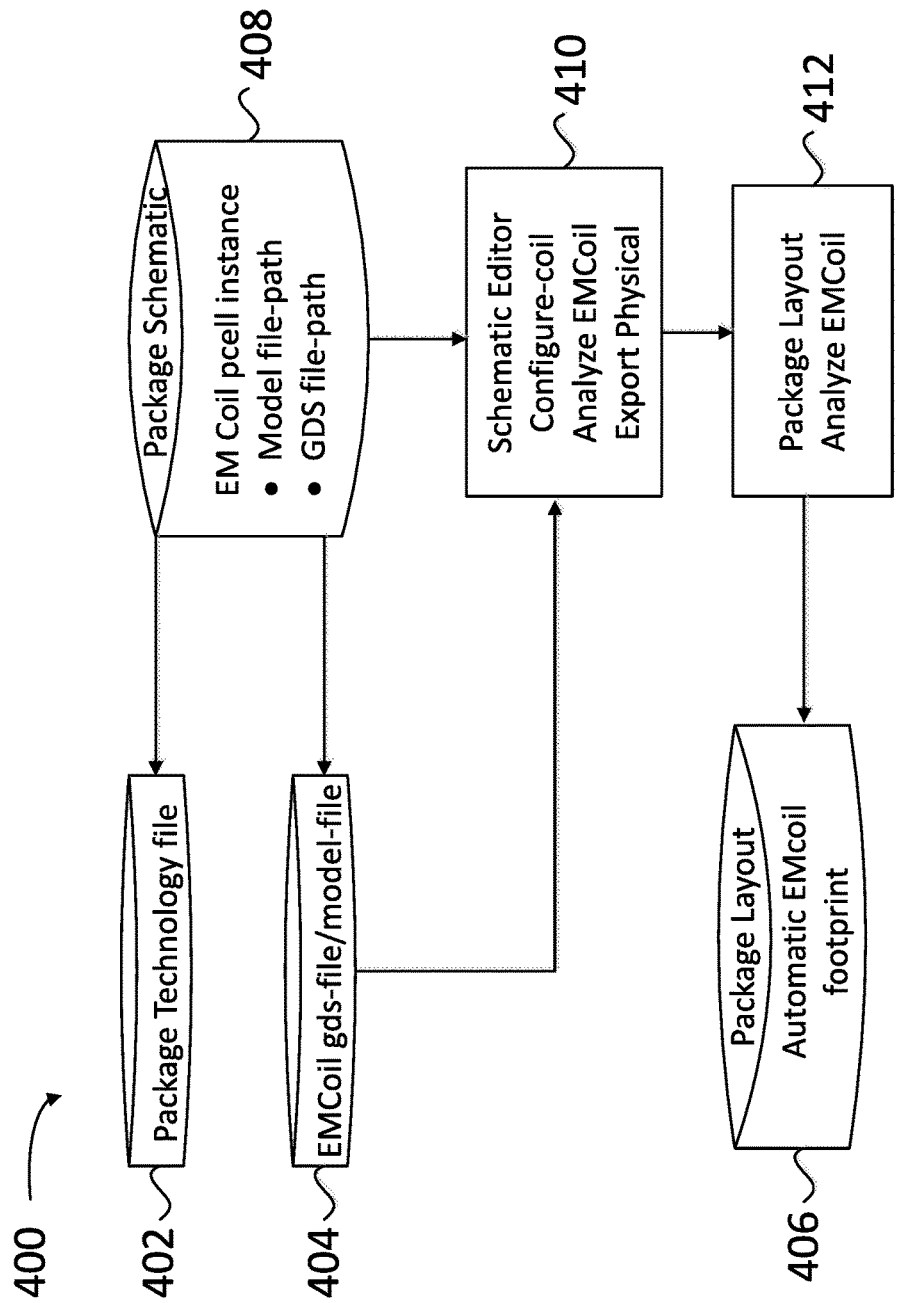
FIG. 4 illustrates an implementation flow for handling an EM coil in a circuit, according to some embodiments.

FIG. 4 illustrates an implementation flow 400 for handling EM coil 101 in a circuit, according to some embodiments. Package schematic database 408 is associated with package technology file in database 402, which includes information on layout layer stack for the EM coil in the PCB for the circuit layout. Package schematic database 408 may also store an EM coil pcell instance having user set parameters such as the name and path to a GDS file for the EM coil, and the name and path to a model file for the EM coil, in database 404.

A schematic editor module 410 instantiates a schematic pcell, which may include selecting a symbol for the EM coil from a template library and placing the symbol in the schematic pcell. The selected symbol may include different pins as compared to the ports in the EM coil model or in the GDS file in database 404. Accordingly, schematic editor module 410 verifies consistency of the number of pins in the symbol with the number of ports in the EM coil model. Schematic editor module 410 is package technology aware, meaning that not only the logic function of the EM coil is considered for instantiating the schematic pcell, but also its package technology file in database 402. For example, schematic editor module 410 is aware of the number and nature of layers included in the package or the PCB for the EM coil in the circuit layout.

In some embodiments, schematic editor module 410 configures the EM coil with a 'configure-coil' command opens a GDS viewer/mapper in schematic editor module 410. Accordingly, schematic editor module 410 may access and view the GDS file for the EM coil to inspect GDS layers for the presence of selected shapes and declare the selected GDS shapes as pin locations. Schematic editor module 410 verifies that the number and distribution of pin locations matches the graphic symbol picked. Some embodiments include an overwrite option to update the graphics and keep the pins as decided by pin-assignment on GDS shapes. Schematic editor module 410 maps GDS layers from GDS files in database 404 to package technology files in database 402.

Upon completion of the configure-coil command, schematic editor module 410 verifies the pcell instance for number of pins against model-file to verify consistency on number of ports. Further, schematic editor module 410 exports a compound file from package schematic database 408 to package layout database 406. The compound file may include a physical netlist, the GDS file, the package-technology file, and the tech-map. Package layout module 412 updates the EM coil footprint, the model file-path, the GDS file-path, and the layer-map file, according to modifications introduced by schematic editor module 410. In some embodiments, package layout module 412 creates the EM coil footprint on-the-fly as it places it on the circuit layout, which desirably reduces the number of manual steps to go in the creation of a schematic symbol having proper pin configurations.

Pointing to a new GDS file in database 404, the user may edit and update the EM coil footprint through pcell parameters with package layout module 412, which also verifies that interfaces through different technology layers remain consistent. Any modifications are annotated as property changes and stored in package schematic database 408. Further, using package layout module 412, the user may update the EM coil pcell instance in package schematic database 408 to bind to updated or modified gds/map/model files in database 404.

In some embodiments, the user can simulate EM coil 101 at pre-layout stage with schematic editor module 410, or in conjunction with rest of the circuit at post-layout stage using package layout module 412. In that regard, schematic editor module 410 and package layout module 412 provide an accurate model of the EM coil for EM simulations. For example, the user can assess the EM coil standalone performance by simulating just the model with a test-vector. The test-vector may include a series of electric input values to test the electrical performance of EM coil 101. As a result of an EM coil simulation, schematic editor module 410 may provide figures of merit for the EM coil performance such as an equivalent lumped-inductance value (L-value), a quality factor, Q, of the EM coil (Q=L/R, wherein R is the EM coil resistance), and an analysis of the frequency-response of the EM coil.

For example, in a VCO circuit it may be desirable to produce a sine wave signal within a specified range of voltage-dependent frequencies. Depending on the parameters of an EM coil (or meander, taper, or combination of the above) in the VCO design, certain parasitic effects distorting the sinusoidal output of the VCO may vary strongly. Accordingly, schematic editor module 410 may provide figures of merit at two different levels for such circumstances. In a first level, schematic editor module 410 may provide a figure of merit for the parasitic distortion of the sinusoidal output of the VCO. In a second level, schematic editor module 410 may determine a Q factor, a lump L value, or a frequency response of the EM coil, alone.

A design tool following implementation flow 400 reduces the number of manual edits for pad replacement, shape merger, pin numbering, reference designator ('refdes') definition (e.g., 'L' for inductor, 'T' for transformer, and the like), labeling and VIA definition. Also, implementation flow 400 removes the need of maintaining large libraries of schematic symbols, layout-footprints and simulation models for different variants of an irregular EM coil. In addition, the user can change pointers to GDS data and implementation flow 400 automatically verifies consistency across layout, schematic and simulation model. Moreover, implementation flow 400 may be applied to any RF-layout from a $3^{rd}$ party EM tool into package layout database 406.

Figure 5A:
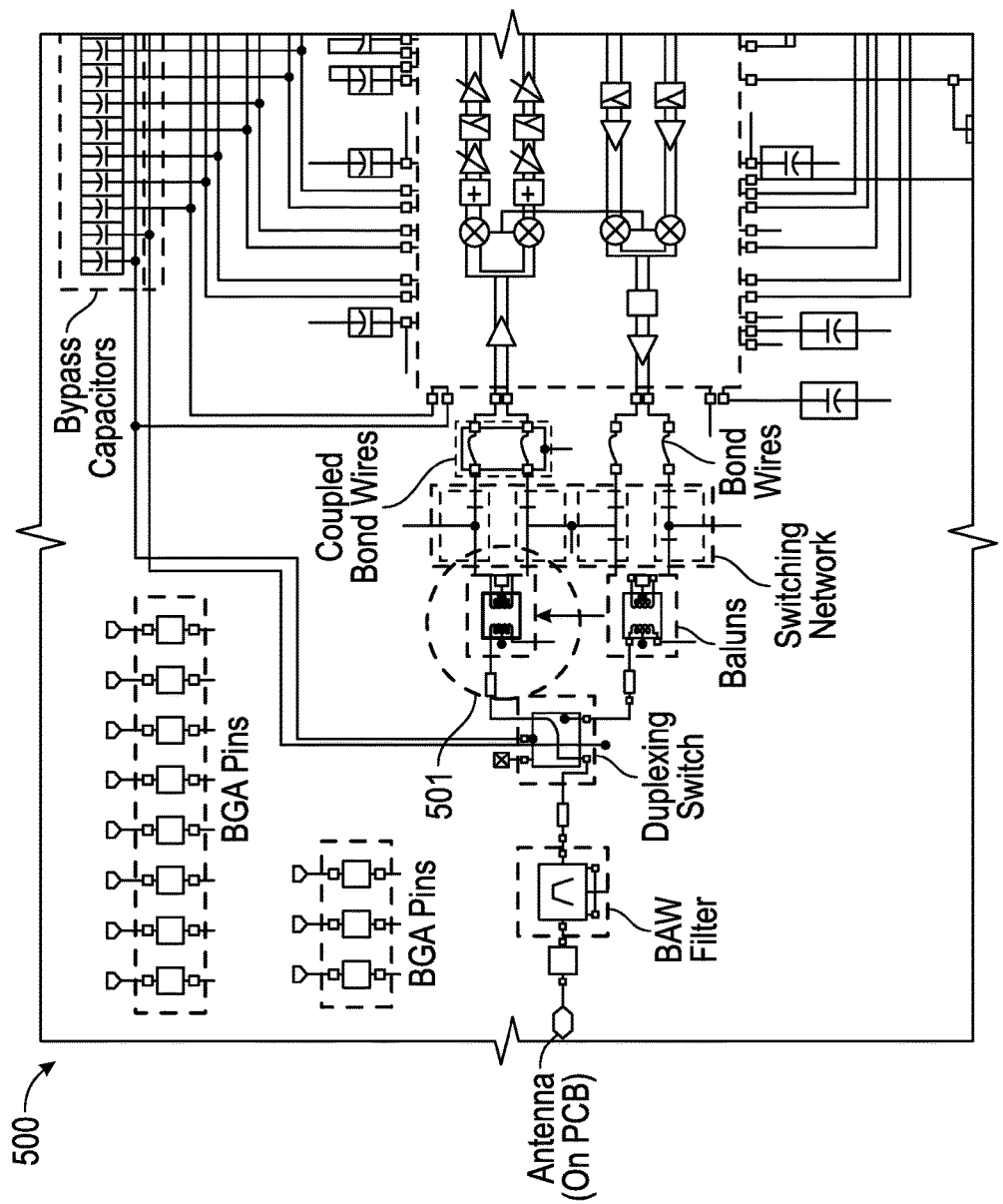
FIG. 5A illustrates a circuit layout including a transformer coil, according to some embodiments.

FIG. 5A illustrates a circuit layout 500 including a transformer coil 501, according to some embodiments. The parameters associated with the physical characteristics of the transformer are stored in a GDS-data file and in a simulation model file, both files being stored in database 404.

Figure 5B:
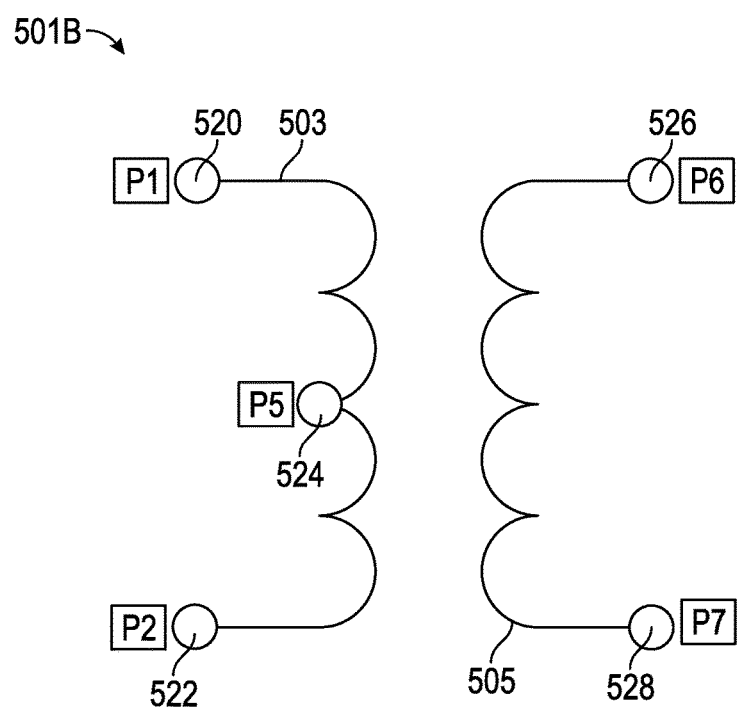
FIG. 5B illustrates a symbolic representation of a transformer coil, according to some embodiments.

FIG. 5B illustrates a symbolic representation 501B of transformer coil 501, according to some embodiments. Accordingly, transformer coil 501 includes at least five ports, 520, 522, 524, 526 and 528. Ports 520, 522 and 524 are associated with a primary induction coil 503, and ports 526 and 528 are associated with a secondary induction coil 505.

Figure 6:
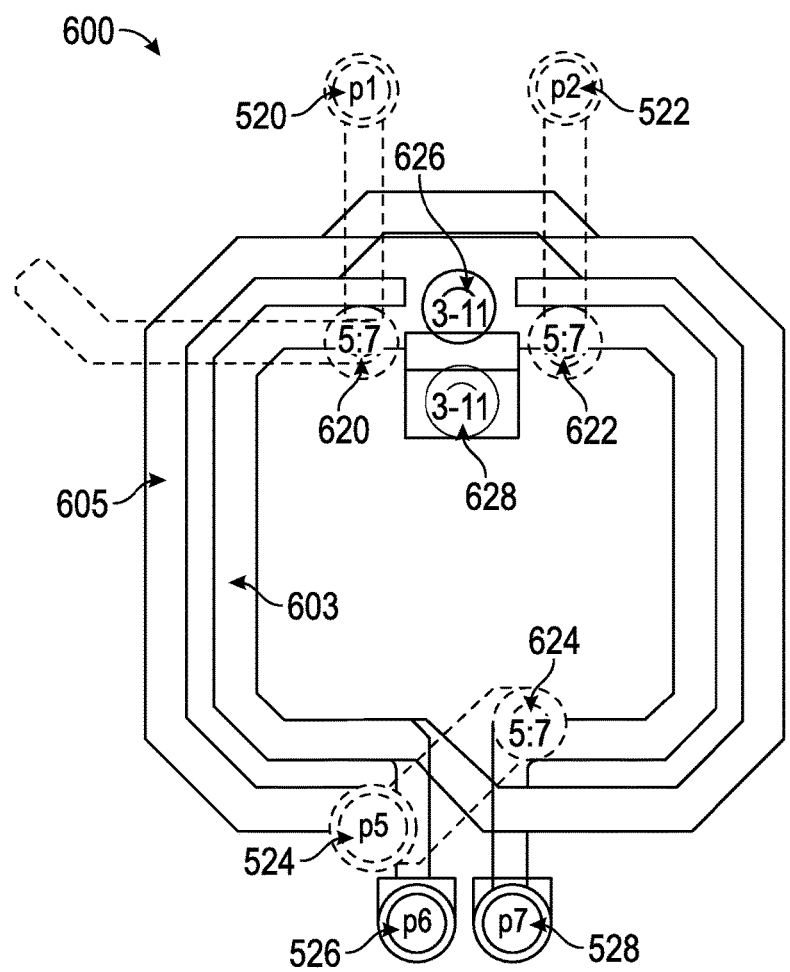
FIG. 6 illustrates a schematic cell representation of a transformer circuit, according to some embodiments.

FIG. 6 illustrates a schematic cell representation 600 of transformer circuit 501, according to some embodiments. Schematic editor module 410 generates schematic cell representation 600 through mapping the GDS layers to tech-file layers. Schematic cell representation 600 is a partial view of the top and bottom technology layers of the pcell associated with transformer circuit 501. Traces 603 and 605 correspond to primary and secondary induction coils 503 and 505, respectively. Note that while schematic cell representation 600 shows traces 603 and 605 as overlapping, the pcell layout in fact maps each of them to a different technology layer ('top' and 'bottom') stacked on top of one another but separated by a dielectric layer in the packaged layout. Schematic cell representation 600 is generated by schematic editor module 410, which performs the steps of: viewing the GDS file associated with transformer coil 501, mapping the GDS layers to technology layer files, and assigning pads to pin locations (e.g., pins 620, 622, 624, 626 and 628, also referred to as VIAS). Schematic editor module 410 also verifies that the number of pins corresponds to the number of ports (e.g., ports 520, 522, 524, 526 and 528). As a result, schematic editor 408 forms a compound file including the physical netlist, the GDS file, the package technology file, and a technology map. The compound file is exported to package layout module 410.

Figure 7:
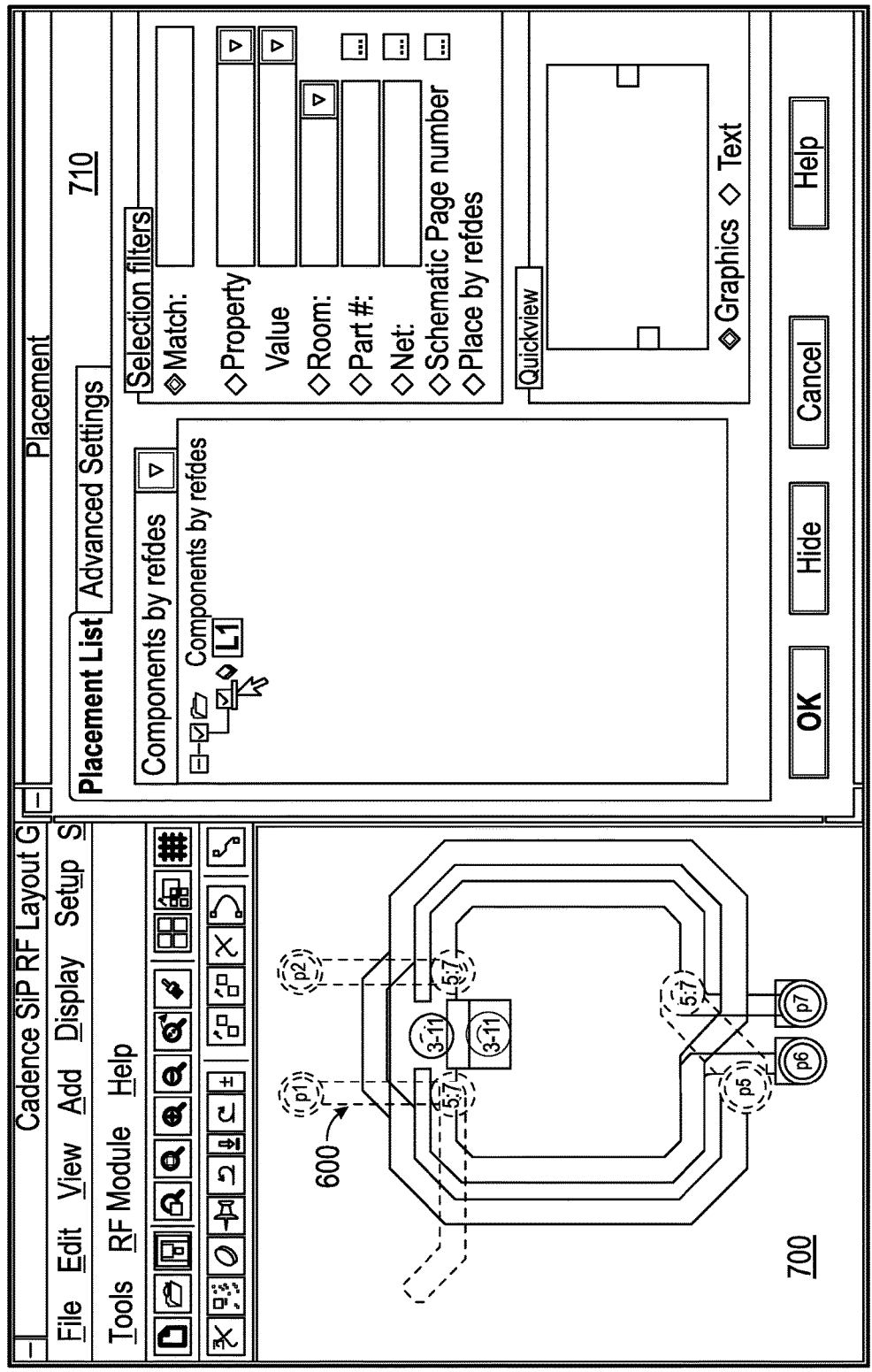
FIG. 7 illustrates a technology layer mapped from a schematic cell representation of a transformer circuit, according to some embodiments.

FIG. 7 illustrates a technology layer 700 selected from schematic cell representation 600 of transformer circuit 501, according to some embodiments. Accordingly, technology layer 700 may be generated by package layout module 410 using the compound file provided by schematic editor 408. A placement template 710 is provided by package layout module 410 to place the compound file for schematic cell representation 600 into a package layout. At the time of placing schematic cell representation 600 into a package layout, package layout module 410 generates a transformer coil footprint associated with transformer coil 501.

Figure 8:
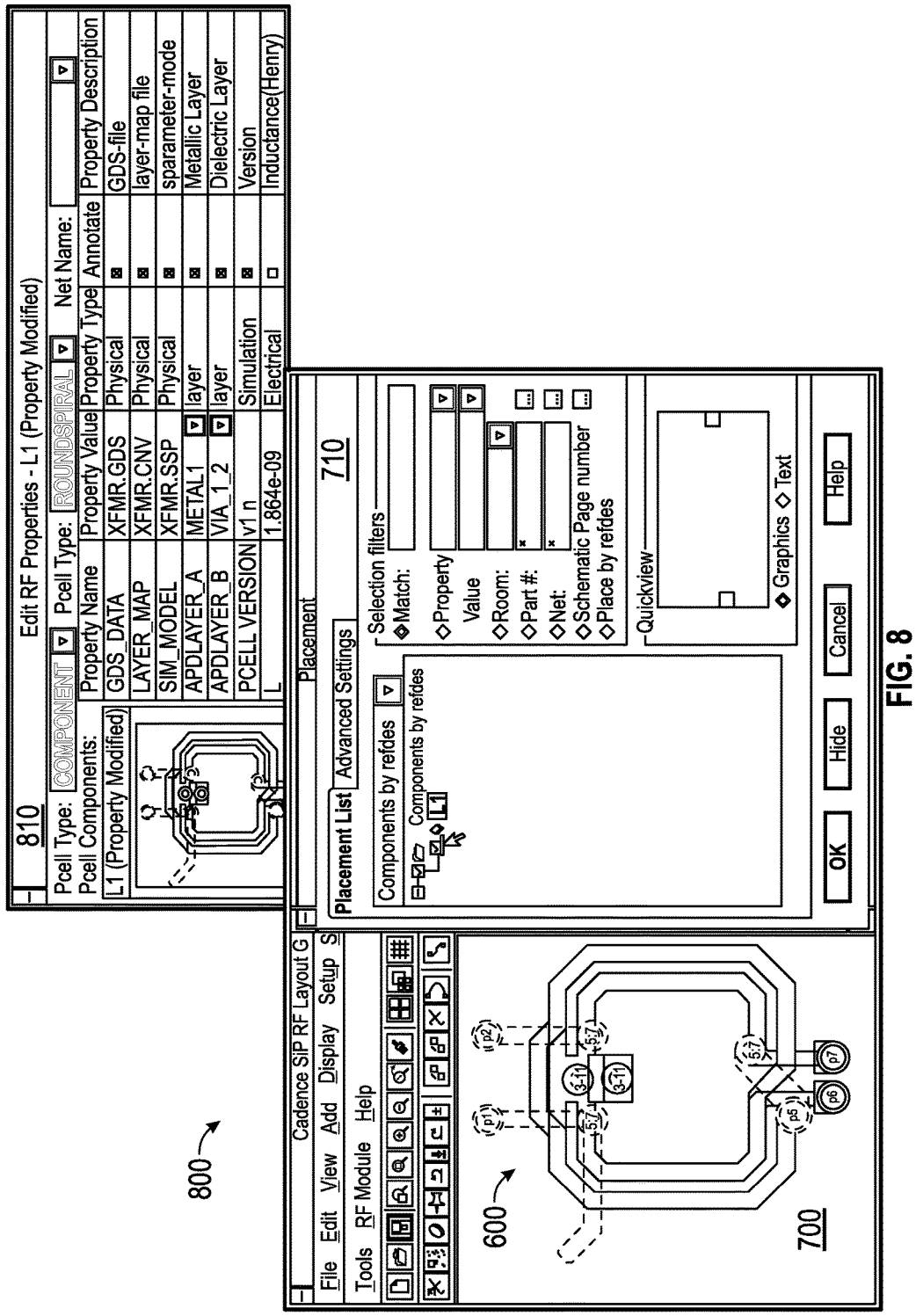
FIG. 8 illustrates an editing template for a transformer circuit after placement in the circuit layout, according to some embodiments.

FIG. 8 illustrates an editing template 800 for transformer circuit 501, according to some embodiments. Editing template 800 may be requested after placing schematic cell representation 600 in the circuit layout, or at any time during the creation of the schematic cell representation 600. Within editing template 800, certain parameters of transformer coil 501 may be modified in schematic cell representation 600 using a layer editor 810. When the modified parameters are entered in layer editor 810, the modified transformer coil is analyzed with schematic editor module 410, or with package layout module 412, to verify consistency of the modified parameters with the different interfaces of the transformer coil in circuit layout 500. As the modified parameters in editing template 800 are entered and verified, package layout module 410 edits the transformer coil footprint and points to a new GDS for the transformer coil. Modified parameters are annotated as property changes back to schematic cell representation 600 and all the data and file links are updated to reflect the modified schematic cell representation.

Layer editor 810 may further enable such tasks as layer-assignment to shapes, shape-merging, VIA definition, pad-assignment and label addition. For all the edits and parameter modifications, schematic editor module 410 performs pre-layout simulation of the modified model, and package layout module 412 performs post-layout simulations including the performance of other elements in the circuit layout. If a performance target is not met, the model-binding or the symbol itself is modified automatically and re-simulated. Correspondingly, new footprints are generated for the different modified models during an optimization procedure.

Figure 9:
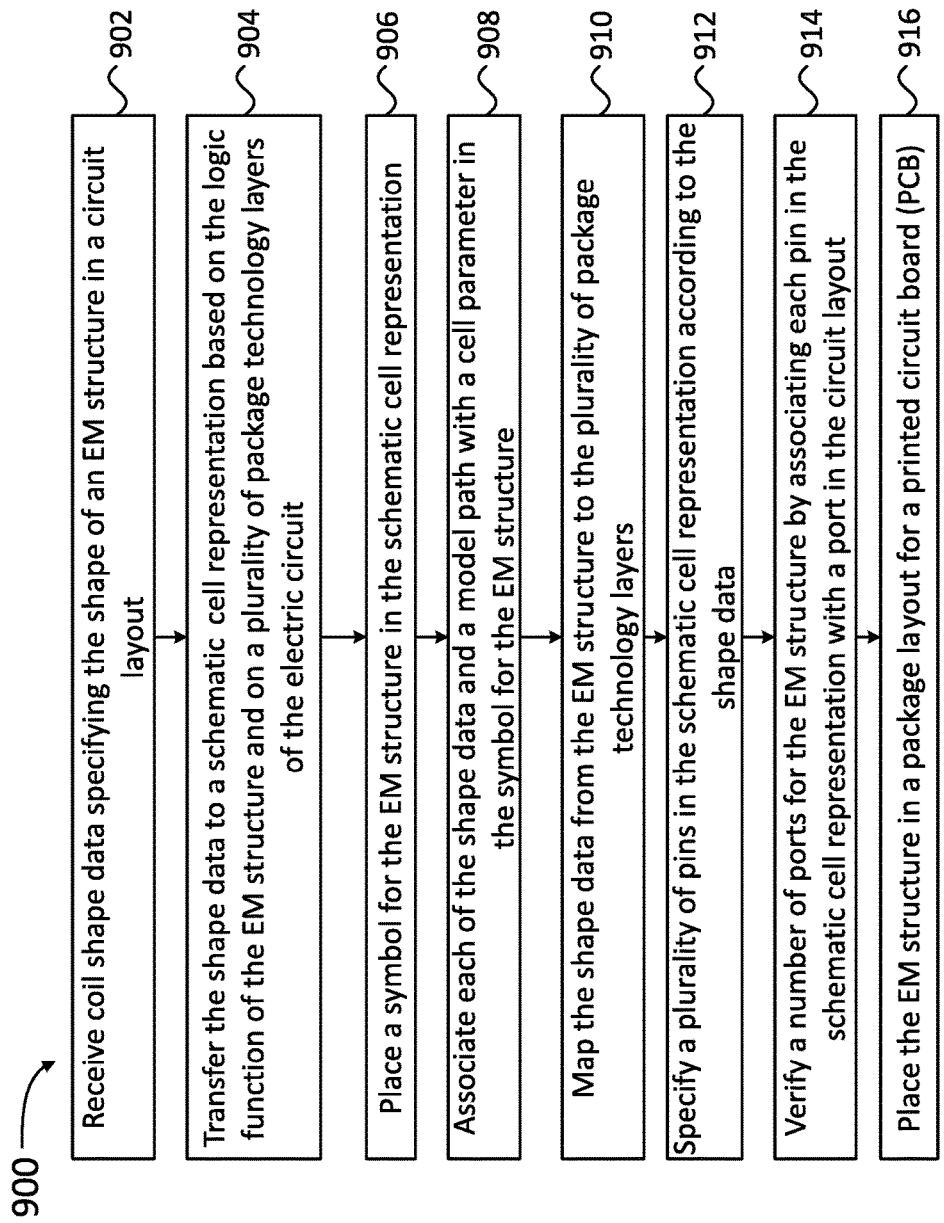
FIG. 9 illustrates steps in a method for generating a circuit layout for an RF system including an EM coil, according to some embodiments.

FIG. 9 illustrates steps in a method 900 for generating a circuit layout in an electronic circuit including an arbitrary EM structure, according to some embodiments. Methods consistent with the present disclosure may include at least some, but not all of the steps illustrated in method 900, performed in a different sequence. Furthermore, methods consistent with the present disclosure may include at least two or more steps as in method 900 performed overlapping in time, or almost simultaneously.

An EM structure in methods consistent with method 900 may include an EM coil, a meander, a taper, or any combination of the above. Furthermore, an electronic circuit in embodiments consistent with method 900 may include an RF system or any component thereof, such as an antenna, a transformer, a VCO, a PLL, and the like. Furthermore, the shapes of EM structures in methods consistent with method 900 may be a regular shape, a symmetric shape, an irregular shape, an asymmetric shape or an arbitrary shape, as disclosed herein.

Method 900 enables the user to drive a layout for an irregular EM structure through use of a pcell flow driven by schematic parameters and/or Layout parameters. The user also has the ability to verify consistency of interfaces across model, coil-shape data and schematic symbols and to automatically create footprint layouts using shape-data passed from a schematic cell representation, during placement of components in the package layout. Further, method 900 enables the user to simulate arbitrary EM structures at schematic or layout stage to assess their electrical performance as standalone structure or in conjunction with rest of circuit.

Step 902 includes receiving shape data specifying the shape of the EM structure in a circuit layout. The EM structure shape may be designed on a silicon or a package substrate for a given electrical performance by a $3^{rd}$ party EM tool. Step 902 may further include receiving an EM structure model including a 'spice' or 'sparameter' file representing the electrical behavior of the physical EM structure. Accordingly, step 902 may include receiving the shape data by retrieving a GDS file provided by a $3^{rd}$ party EM tool.

Step 904 includes transferring the shape data to a schematic cell representation based on the logic function of the EM structure and on a plurality of package technology layers of the circuit layout. In some embodiments, step 904 includes retrieving the package technology layers from a package technology file, wherein the package technology file provides information on layout layer stack. In some embodiments, step 904 may include instantiating the schematic cell representation for the EM structure in a schematic symbol picked from a template-library having different pins.

Step 906 includes placing a symbol for the EM structure in the schematic cell representation. In some embodiments, step 906 may include setting model parameters in the schematic cell representation. Model parameters in step 906 may include the name and path to a selected GDS file, and the name and path to a selected model file.

Step 908 includes associating the shape data and model paths with a cell parameter in the symbol for the EM structure. Step 908 may include configuring a coil command to open a GDS viewer and mapper. Step 908 may also include inspecting GDS layers for the presence of shapes. Step 908 may include mapping GDS layers to package technology file layers, and declaring GDS shapes as pin-locations. Further, step 908 may include verifying that the number and disposition of pins matches a selected graphic symbol (shape). When there is a mismatch, step 908 may further include issuing a warning message to the user, indicating that a mismatch has been found. Accordingly, step 908 may include overriding the warning when the user decides to proceed with the design despite of the mismatch. Step 908 may include updating the graphics when an overwrite option is selected, to keep the pins as decided by a pin-assignment on GDS shapes.

Step 910 includes mapping the shape data from the EM structure to a plurality of package technology layers. Step 912 includes specifying a plurality of pins in the schematic cell representation according to the shape data. Step 912 may include verifying consistency in the pcell instance between the number of pins and the number of ports in a model-file.

Step 914 includes verifying a number of ports for the EM structure by associating each pin in the schematic cell representation with a port in the circuit layout. In some embodiments, step 912 includes exporting a compound file from the schematic cell representation to a package layout file.

Step 916 includes placing the EM structure in a package layout for a printed circuit board (PCB). Accordingly, step 916 may include simulating the performance of the EM structure as a standalone device or within the context of the entire circuit or a portion of the circuit including a plurality of devices other than the EM structure. Moreover, step 916 may include determining whether the layout footprint of the EM structure fits in the package layout for the entire circuit including design constraints (e.g., electrical constraints, spatial constraints, physical constraints, technological constraints, or thermal constraints).

When the user is not satisfied with either the electric performance or the footprint layout of the EM structure, step 916 may include updating the model for the EM structure with a new configuration. Accordingly, step 916 may include repeating configuration coil command sequences until the user is satisfied with the results. In some embodiments, updating the model for the EM structure in step 916 may include modifying parameters for a pcell associated with the EM structure using a schematic editor module (e.g., modifying a GDS file path or a model file path in database 404 using schematic editor module 410). Further according to some embodiments, updating the model for the EM structure in step 916 may include verifying that for the new GDS file and the new technology layer map, footprint, model and symbol associated with the EM structure remain consistent. When the model for the EM structure is updated as described above, the symbol for the EM structure is also updated accordingly (e.g., symbol for pcell 201).

Figure 10:
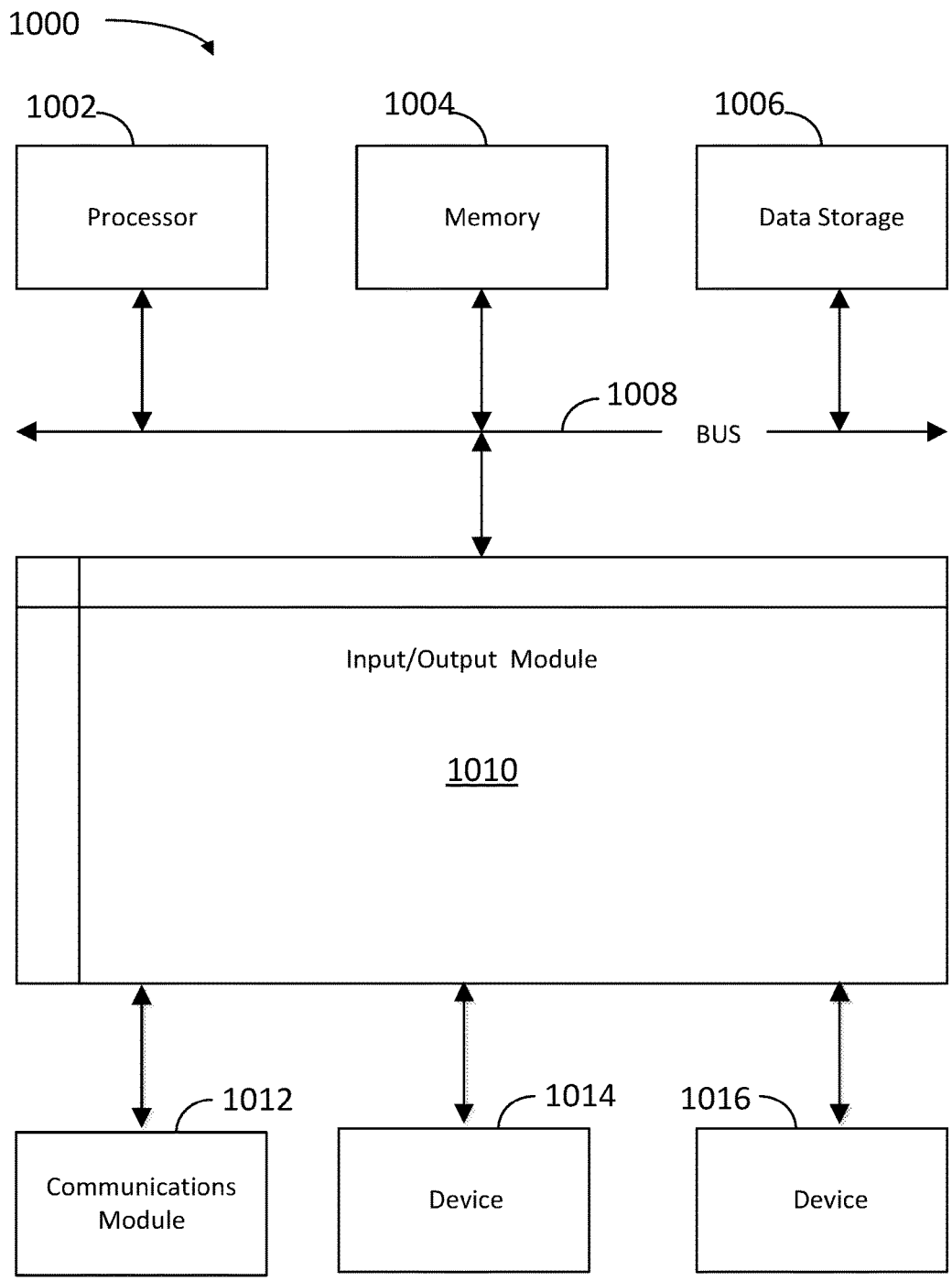
FIG. 10 is a block diagram illustrating an example computer system with which the methods and steps illustrated in FIGS. 1-9 can be implemented, according to some embodiments.

FIG. 10 is a block diagram illustrating an example computer system 1000 with which the methods and steps illustrated in FIGS. 1-9 can be implemented, according to some embodiments. In certain aspects, computer system 1000 can be implemented using hardware or a combination of software and hardware, either in a dedicated server, integrated into another entity, or distributed across multiple entities.

Computer system 1000 includes a bus 1008 or other communication mechanism for communicating information, and a processor 1002 coupled with bus 1008 for processing information. By way of example, computer system 1000 can be implemented with one or more processors 1002. Processor 1002 can be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information. Accordingly, processors 1002 may include any one, or all of schematic editor module 410, or package layout module 412.

Computer system 1000 includes, in addition to hardware, code that creates an execution environment for the computer program in question, e.g., code that constitutes processor firmware, a protocol stack, a database management system, an operating system, or a combination of one or more of them stored in an included memory 1004, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1008 for storing information and instructions to be executed by processor 1002. Processor 1002 and memory 1004 can be supplemented by, or incorporated in, special purpose logic circuitry.

The instructions may be stored in memory 1004 and implemented in one or more computer program products, i.e., one or more modules of computer program instructions encoded on a computer readable medium for execution by, or to control the operation of, the computer system 1000.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network, such as in a cloud-computing environment. The processes and logic flows described in this specification can be performed by one or more programmable processors executing one or more computer programs to perform functions by operating on input data and generating output.

Computer system 1000 further includes a data storage device 1006 such as a magnetic disk or optical disk, coupled to bus 1008 for storing information and instructions. Data storage device 1006 may include any one of the databases described above, such as schematic database 302, Netlist database 304, package layout databases 306 and 406, s-parameter database 308, pcell model database 310, database 402, database 404, package schematic database 408, and package layout database 406.

Computer system 1000 is coupled via input/output module 1010 to various devices. The input/output module 1010 is any input/output module. Example input/output modules 1010 include data ports such as USB ports. The input/output module 1010 is configured to connect to a communications module 1012. Example communications modules 1012 include networking interface cards, such as Ethernet cards and modems. In certain aspects, the input/output module 1010 is configured to connect to a plurality of devices, such as an input device 1014 and/or an output device 1016. Example input devices 1014 include a keyboard and a pointing device, e.g., a mouse or a trackball, by which a user can provide input to the computer system 1000. Other kinds of input devices 1014 are used to provide for interaction with a user as well, such as a tactile input device, visual input device, audio input device, or brain-computer interface device.

Methods as disclosed herein may be performed by computer system 1000 in response to processor 1002 executing one or more sequences of one or more instructions contained in memory 1004. Such instructions may be read into memory 1004 from another machine-readable medium, such as data storage device 1006. Execution of the sequences of instructions contained in main memory 1004 causes processor 1002 to perform the process steps described herein (e.g., as in method 900). One or more processors in a multi-processing arrangement may also be employed to execute the sequences of instructions contained in memory 1004. Processor 1002 may process the executable instructions and/or data structures by remotely accessing the computer program product, for example by downloading the executable instructions and/or data structures from a remote server through communications module 1012 (e.g., as in a cloud-computing environment).

In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. For example, some aspects of the subject matter described in this specification may be performed on a cloud-computing environment. Accordingly, in certain aspects a user of systems and methods as disclosed herein may perform at least some of the steps by accessing a cloud server through a network connection. Further, data files, circuit diagrams, performance specifications and the like resulting from the disclosure may be stored in a database server in the cloud-computing environment, or may be downloaded to a private storage device from the cloud-computing environment.

The term "machine-readable storage medium" or "computer readable medium" as used herein refers to any medium or media that participates in providing instructions or data to processor 1002 for execution. Such a medium may take many forms, including, but not limited to, non-volatile media, volatile media, and transmission media.

Those skilled in the art will readily appreciate that the methods described herein, or large portions thereof may be automated at some point such that a computerized system may be programmed to fabricate an RF-system as disclosed herein. Computer hardware used to implement the various methods and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data.

To the extent that the term "include," "have," or the like is used in the description or the claims, such term is intended to be inclusive in a manner similar to the term "comprise" as "comprise" is interpreted when employed as a transitional word in a claim.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The disclosure illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

The invention claimed is:

1. A method, comprising:
   receiving shape data specifying a shape of an electromagnetic (EM) structure in a circuit layout;
   transferring the shape data to a schematic cell representation in an EM tool, based on a logic function of the EM structure and a plurality of package technology layers of the circuit layout;
   placing, with the EM tool, a symbol for the EM structure in the schematic cell representation;
   associating each of the shape data and a model path with a cell parameter in the symbol for the EM structure;
   mapping the shape data to the plurality of package technology layers;
   specifying a plurality of pins in the schematic cell representation according to the shape data;
   verifying a number of ports for the EM structure by associating each pin in the schematic cell representation to a port in the circuit layout;
   testing, by providing a test-vector including electric input values for a first port in the EM structure, an EM performance of the EM structure;
   determining a figure of merit for the EM performance of the EM structure based on an output value from a second port for the EM structure; and
   placing the EM structure in a package layout for fabrication on a printed circuit board according to the package layout.

2. The method of claim 1, wherein receiving shape data comprises receiving shape data for an EM coil, a meander, a taper, or any combination of the above, and the circuit layout corresponds to an electric circuit in a radio-frequency (RF) system.

3. The method of claim 1, wherein receiving shape data comprises retrieving the circuit layout from a graphic database system (GDS) file associated with an electric circuit.

4. The method of claim 1, wherein mapping the shape data from the EM structure to a plurality of package technology layers comprises inspecting the plurality of package technology layers of the circuit layout to detect a presence of a shape.

5. The method of claim 1, wherein specifying a plurality of pins in the schematic cell representation according to the shape data comprises associating a shape in a package technology layer with the plurality of pins in the schematic cell representation.

6. The method of claim 1, wherein mapping the shape data from the EM structure to a plurality of package technology layers of the circuit layout comprises verifying that a number of pins matches a graphic symbol for a shape in at least one of the plurality of package technology layers.

7. The method of claim 1, wherein placing the EM structure in the package layout comprises exporting a compound file to the package layout, the compound file including a GDS file with the circuit layout, a technology layer map, and an electrical model for the EM structure.

8. The method of claim 1, wherein mapping the shape data from the EM structure comprises mapping an irregular shape.

9. The method of claim 1, further comprising verifying an interface consistency between an electrical model of the EM structure, the symbol for the EM structure in the schematic cell representation, and the circuit layout.

10. The method of claim 1, further comprising forming a footprint layout for the EM structure in the package layout using the shape data from the schematic cell representation.

11. The method of claim 1, further comprising simulating a standalone performance of the EM structure in the schematic cell representation and in the package layout.

12. The method of claim 1, further comprising simulating a performance of the EM structure in conjunction with at least another component in the circuit layout.

13. The method of claim 1, further comprising obtaining a selected point in the circuit layout and verifying consistency between the package layout, the schematic cell representation, and an electrical model for the selected point in the circuit layout.

14. The method of claim 1, further comprising overwriting a pin assignment in the EM structure to maintain a pad location in the circuit layout according to a selected shape of the EM structure.

15. The method of claim 1, wherein placing the EM structure in the package layout comprises simulating a performance of the EM structure as one of a standalone component or in combination with at least one other component in the circuit layout.

16. A system, comprising:
   a memory, storing computer code; and
   at least one processor that executes the computer code to:
      receive shape data specifying a shape of an electromagnetic (EM) structure in a circuit layout;
      transfer the shape data to a schematic cell representation in an EM tool, based on a logic function of the EM structure and a plurality of package technology layers of the circuit layout;
      place, with the EM tool, a symbol for the EM structure in the schematic cell representation;
      associate each of the shape data and a model path with a cell parameter in the symbol for the EM structure;
      map the shape data to the plurality of package technology layers;
      specify a plurality of pins in the schematic cell representation according to the shape data;

verify a number of ports for the EM structure by associating each pin in the schematic cell representation to a port in the circuit layout;

test, by providing a test-vector including electric input values for a first port in the EM structure, an EM performance of the EM structure;

determine a figure of merit for the EM performance of the EM structure based on an output value from a second port for the EM structure; and place the EM structure in a package layout for fabrication on a printed circuit board according to the package layout, wherein receiving shape data comprises receiving shape data for an EM coil, a meander, a taper, or any combination of the above.

17. The system of claim 16, wherein the at least one processor further executes code to simulate one of a standalone performance of the EM structure in the schematic cell representation or in conjunction with at least another component in the circuit layout.

18. A non-transitory, computer readable medium storing commands which, when executed by a processor cause a computer to perform the steps of:

receiving shape data specifying a shape of an electromagnetic (EM) structure in a circuit layout;

transferring the shape data to a schematic cell representation based on a logic function of the EM structure in an EM tool, and a plurality of package technology layers of the circuit layout;

placing, with the EM tool, a symbol for the EM structure in the schematic cell representation;

associating each of the shape data and a model path with a cell parameter in the symbol for the EM structure;

mapping the shape data to the plurality of package technology layers;

specifying a plurality of pins in the schematic cell representation according to the shape data;

verifying a number of ports for the EM structure by associating each pin in the schematic cell representation to a port in the circuit layout;

testing, by providing a test-vector including electric input values for a first port in the EM structure, an EM performance of the EM structure;

determining a figure of merit for the EM performance of the EM structure based on an output value from a second port for the EM structure; and placing the EM structure in a package layout for fabrication on a printed circuit board according to the package layout, wherein:

receiving shape data comprises receiving shape data for an EM coil, a meander, a taper, or any combination of the above, and retrieving the circuit layout from a graphic database system (GDS) file associated with an electric circuit.

19. The non-transitory, computer readable medium of claim 18, further storing commands for simulating one of a standalone performance of the EM structure in the schematic cell representation or in conjunction with at least another component in the circuit layout.

* * * * *